(12) United States Patent
Loukusa et al.

(10) Patent No.: US 7,688,110 B2
(45) Date of Patent: Mar. 30, 2010

(54) SYSTEM FOR PROVIDING A COMPLEMENTARY METAL-OXIDE SEMICONDUCTOR (CMOS) EMITTER COUPLED LOGIC (ECL) EQUIVALENT INPUT/OUTPUT (I/O) CIRCUIT

(75) Inventors: Jeffrey D. Loukusa, Hamel, MN (US); Said E. Abdelli, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 109 days.

(21) Appl. No.: 11/970,327

(22) Filed: Jan. 7, 2008

(65) Prior Publication Data
US 2009/0174432 A1    Jul. 9, 2009

(51) Int. Cl.
*H03K 19/0175*    (2006.01)
(52) U.S. Cl. ............................... 326/66; 326/73; 326/77
(58) Field of Classification Search .................. 326/66, 326/73, 77
See application file for complete search history.

(56) References Cited

U.S. PATENT DOCUMENTS

| 4,437,171 | A | * | 3/1984 | Hudson et al. ............. 365/177 |
| 4,496,856 | A |   | 1/1985 | Ranson et al. |
| 4,533,842 | A |   | 8/1985 | Yang |
| 4,656,375 | A |   | 4/1987 | Lauffer et al. |
| 4,968,905 | A | * | 11/1990 | Sanwo et al. .................. 326/32 |
| 5,034,635 | A |   | 7/1991 | Ten Eyck |
| 5,166,558 | A | * | 11/1992 | Ohsawa ....................... 326/71 |
| 6,535,017 | B1 |   | 3/2003 | Fulkerson |
| 6,563,342 | B1 | * | 5/2003 | Fulkerson ................... 326/73 |
| 7,088,160 | B2 |   | 8/2006 | Harms et al. |
| 7,274,216 | B2 |   | 9/2007 | Pickering et al. |

* cited by examiner

*Primary Examiner*—Anh Q Tran
(74) *Attorney, Agent, or Firm*—Shumaker & Sieffert, P.A.

(57) ABSTRACT

A system for providing a CMOS I/O circuit design that may replace existing bipolar I/O circuitry, and thus behave in substantially the same manner as bipolar I/O circuitry. Thus, an I/O circuit using a standard CMOS process is made that mimics operation of an ECL I/O circuit created using bipolar transistors. The CMOS input circuitry can receive input signals from an ECL output circuit, so as to mimic traditional ECL input circuitry. The CMOS output circuitry can output signals to an ECL input circuit, so as to mimic traditional ECL output circuitry. The CMOS I/O circuitry is designed to mimic the temperature dependent signals level, as present within traditional ECL I/O circuitry.

19 Claims, 7 Drawing Sheets

VDD = 0.0 Volts
VSS = -5.2 Volts
VTT = -2.0 Volts

ECL Single Ended Input Receiver

ECL Single Ended Output Driver

SYSTEM FOR PROVIDING A COMPLEMENTARY METAL-OXIDE SEMICONDUCTOR (CMOS) EMITTER COUPLED LOGIC (ECL) EQUIVALENT INPUT/OUTPUT (I/O) CIRCUIT

STATEMENT REGARDING FEDERALLY SPONSORED RESEARCH

The United States Government may have acquired certain rights in this invention pursuant to Contract No. F09603-02-D-0055-0006, awarded by the Air Force.

FIELD

The present application relates to a Complementary Metal-Oxide Semiconductor (CMOS) Input/Output (I/O) circuit that can be used within an Emitter Coupled Logic (ECL) system.

BACKGROUND

Input/output, or I/O, is circuitry that allows parts of an information processing system (such as a computer or chip) to communicate with each other. Inputs are signals received by the chip and outputs are signals sent from the chip. I/O circuitry is usually located on a periphery of the computer chip to perform as an interface between chips. Output circuitry receives signals from a core of a chip and transforms the signals electrically into a form that can be transmitted across a cable or board to another chip. Input circuitry receives signals from the cable or board and transforms signals electrically into a form that can be used by a core of the chip.

Many legacy I/O circuit designs use ECL (Emitter-Coupled Logic) circuitry. ECL is a logic family in which current is steered through bipolar transistors to compute logical functions. ECL is based on use of a multi-input differential amplifier to amplify and combine digital signals, and emitter followers to adjust DC voltage levels. As a result, none of the transistors enter saturation, nor do the transistors become completely turned off. The transistors remain entirely within their active operating regions at all times. As a result, the transistors do not have a charge storage time to contend with and can change states much more rapidly, allowing ECL circuits to operate at a very high speed. However, the transistors are continuously drawing current, which means the circuits require a lot of power.

ECL uses bipolar transistor technology rather than CMOS technology. Therefore, ECL specifications are usually written around bipolar capabilities, which are different than CMOS. For example, changes in temperature levels cause inherent shifting of input and output levels when using bipolar transistors. CMOS transistors may not be affected in the same manner. Further, CMOS integrated circuits typically operate with a power supply of 5 V or 3.3 V, while ECL traditionally operates with a negative power supply (such as −5 V). Standard ECL is not generally compatible with CMOS circuits. Accordingly, driving an ECL circuit from a CMOS circuit presents difficult design issues.

It would be desirable to replace ECL circuitry, when needed, with current CMOS circuitry and processes rather than redesigning the whole system. Thus, an I/O design or interface cell produced using CMOS processes is needed that behaves in the same manner as existing bipolar I/O circuitry.

SUMMARY

Within embodiments presented below, a Complementary Metal-Oxide Semiconductor (CMOS) Emitter Coupled Logic (ECL) output circuit is provided. The CMOS ECL output circuit has an input and an output, and the input is arranged to receive an input signal from a CMOS circuit and the output is arranged to provide an output signal to an ECL circuit. The CMOS ECL output circuit includes a CMOS differential amplifier that has first and second inputs and an output, and a reference circuit arranged to provide a reference voltage to the first input of the CMOS differential amplifier. The reference voltage varies based on a temperature of the CMOS ECL output circuit. The CMOS ECL output circuit further includes a feedback loop coupled between the output of the CMOS differential amplifier and the second input of the CMOS differential amplifier, and carries a signal to maintain the output signal of the ECL circuit at about the same level as the reference voltage so that the output signal varies in about the same manner as the reference voltage varies due to temperature changes.

In another embodiment, a CMOS ECL input circuit is provided that has an input and an output, and the input is arranged to receive an output signal from an ECL circuit and the output is arranged to provide an input signal to a CMOS circuit. The CMOS ECL input circuit includes a CMOS differential amplifier that has first and second inputs, and the output from the ECL circuit is input to the second input. The CMOS ECL input circuit also includes a reference circuit arranged to provide a reference voltage to the first input of the CMOS differential amplifier, and the reference voltage varies based on a temperature of the CMOS ECL input circuit. In addition, the CMOS differential amplifier is arranged to output the input signal to the CMOS circuit, and the input signal, in response to temperature changes, varies in about the same manner as the output signal from the ECL circuit varies due to the temperature changes.

In another embodiment, a CMOS ECL input/output (I/O) circuit is provided that includes a first input and a first output. The first input receives an output from an ECL circuit and the first output outputs an input to a CMOS circuit. The input to the CMOS circuit, in response to temperature changes, varies in about the same manner as the output from the ECL circuit varies due to the temperature changes. The CMOS ECL I/O circuit also includes a second input and a second output, and the second input receives an output from the CMOS circuit and the second output outputs an input to the ECL circuit so that the input to the ECL circuit varies due to temperature changes.

These and other aspects will become apparent to those of ordinary skill in the art by reading the following detailed description, with reference where appropriate to the accompanying drawings. Further, it should be understood that the embodiments noted herein are not intended to limit the scope of the invention as claimed.

DETAILED DESCRIPTION

The present application provides a CMOS I/O circuit design that may replace existing bipolar I/O circuitry, and thus behaves in substantially the same manner as bipolar I/O circuitry. Thus, an I/O circuit using a standard CMOS process is made that mimics operation of an ECL I/O circuit created using bipolar transistors. This enables CMOS processes to be used in ASIC applications that utilize ECL circuits, which were traditionally built using bipolar processes.

The present application includes CMOS circuitry for both input and output circuitry to transfer signals between ECL circuits. For example, the CMOS input circuitry can receive input signals from an ECL circuit, so as to mimic traditional ECL input circuitry. The CMOS output circuitry can be used to transfer signals off of an integrated circuit. The CMOS output circuitry may be coupled to various wires, cables or traces that are generally described as electrical transmission lines. The CMOS output circuitry, so as to mimic the traditional ECL output circuitry, may be coupled to the input terminals of other ECL input circuits. The CMOS Input/Output circuitry may be part of a large integrated circuit or ASIC, or may be an entirely separate integrated circuit dedicated to driving signal lines.

Figure 1:
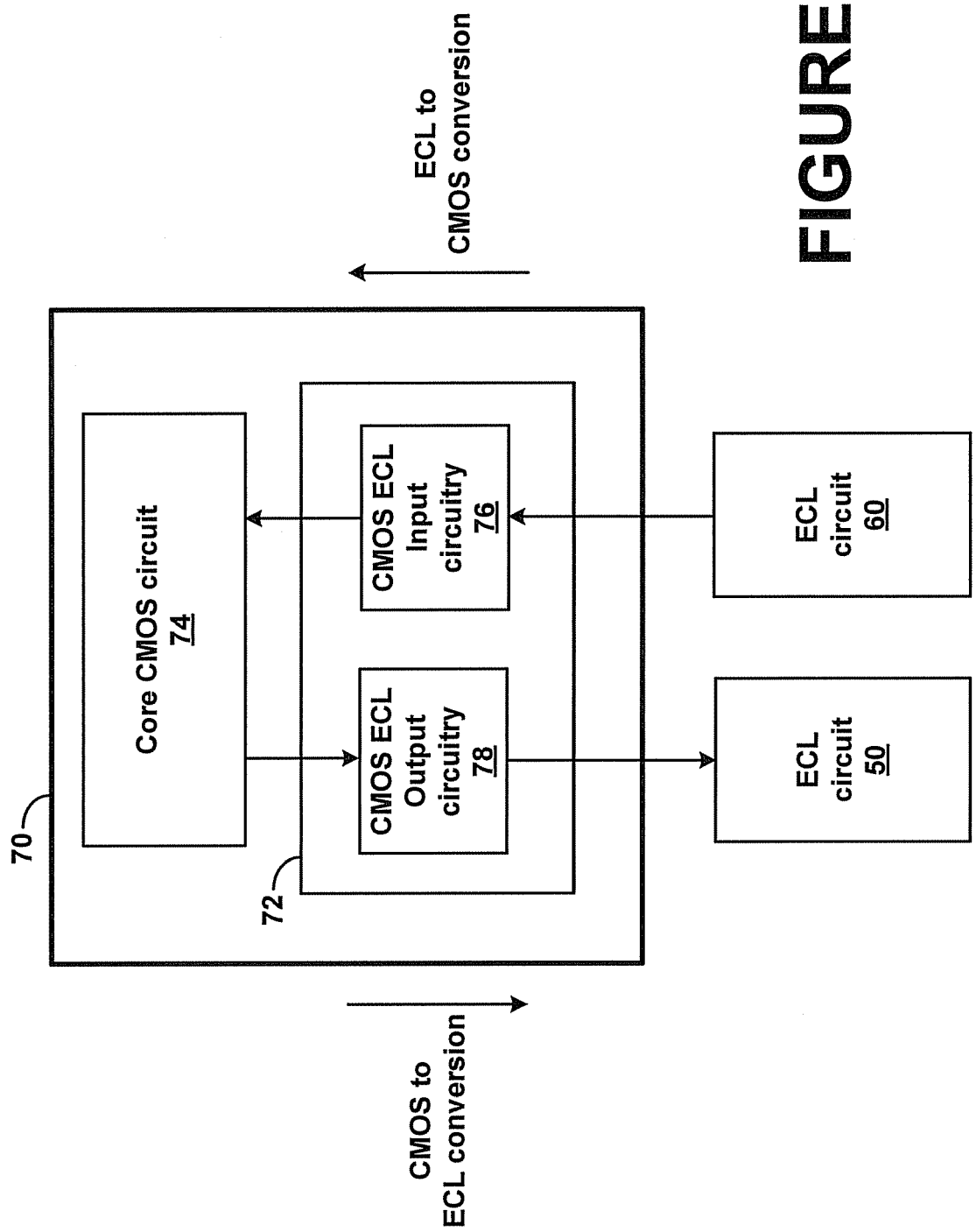
FIG. 1 illustrates a block diagram of an example circuitry layout used in the present application.

FIG. 1 illustrates a block diagram of an example circuitry layout used in the present application. An ECL circuit 60 may output ECL signals (e.g., typically a logic high is about −0.9V and a logic low is about −1.8 V), to another ECL circuit 50 via an interface circuit 70. The interface circuit 70 includes CMOS ECL equivalent I/O circuitry 72 and a core CMOS circuit 74. The CMOS ECL equivalent I/O circuitry 72 includes CMOS ECL input circuitry 76 and CMOS ECL output circuitry 78.

The interface circuit 70 operates to replace old ECL bipolar transistor-type I/O circuits. Existing ECL bipolar transistor-type I/O circuitry operates using negative voltages and could have a preset fingerprint and package size. The interface circuit 70 can be made to use the same package size, with the same pinouts, and to operate using the same voltages. Thus, the interface circuit 70 receives ECL signals from the ECL output circuit 60 at the CMOS ECL input circuitry 76, and converts the ECL signals into voltages used by the core CMOS circuit 74, which may be about 0 V for a logic high and about −5.2 V for a logic low. Then, the CMOS ECL output circuitry 78 converts the CMOS signals from the core CMOS circuit 74 into ECL signals to be transmitted to the ECL input circuit 50. Because typical ECL circuits operate on a negative voltage scale, the core CMOS circuit 74 may also operate on a negative voltage scale.

Thus, the interface circuit 70 is designed to receive an ECL signal, convert the ECL signal into a CMOS signal for processing by a CMOS circuit, and then to convert the CMOS signal back to an ECL signal to be output to an ECL circuit. The core CMOS circuit 74 may perform any number of processing functions on the received signals and may include many different types of circuitry such as (but not limited to) registers for storage.

Figure 2:
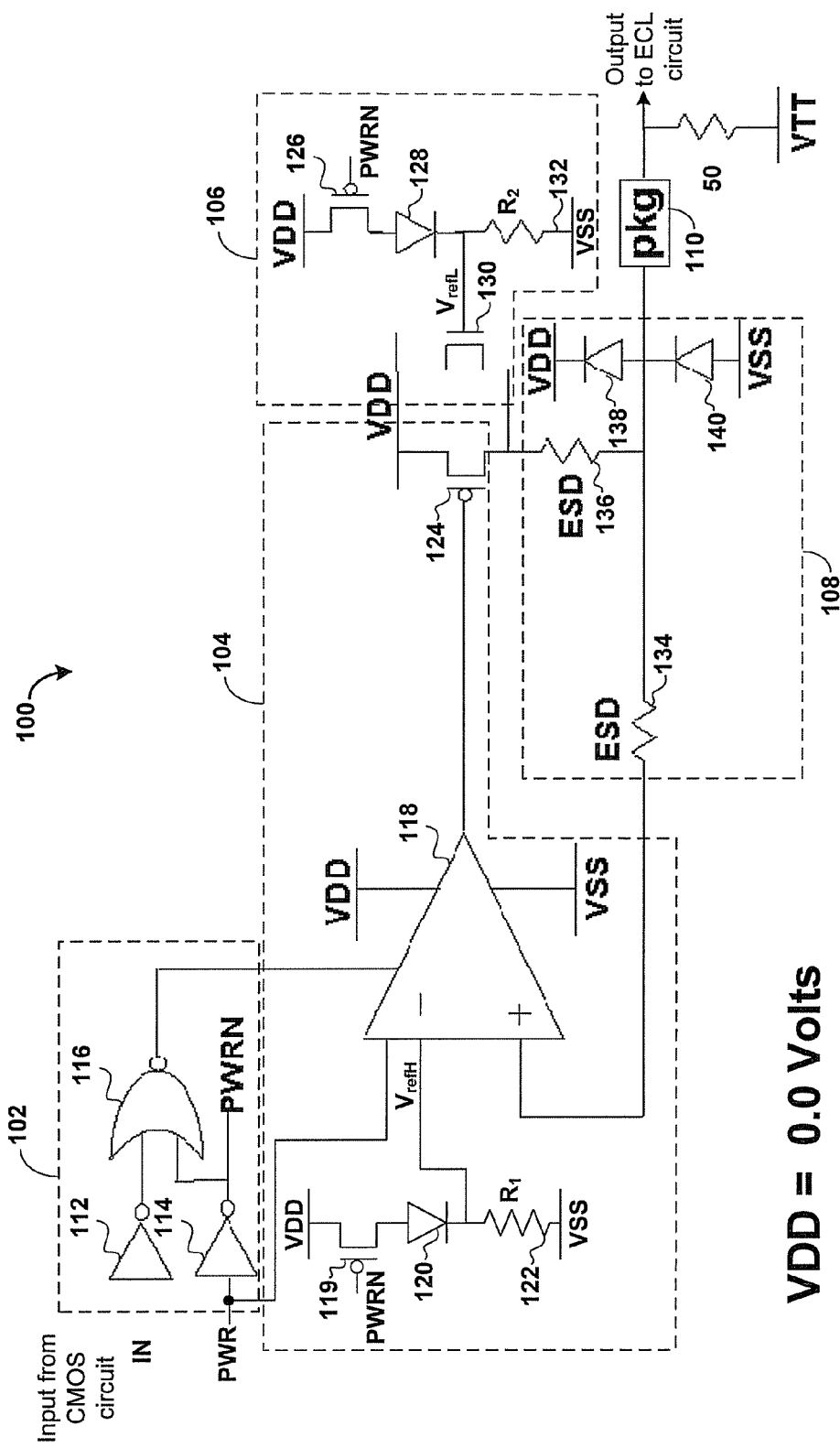
FIG. 2 is a circuit diagram showing an example of a CMOS ECL output circuit.

Referring now to the figures, FIG. 2 is a circuit diagram showing an example of a CMOS output circuitry 100 (e.g., a CMOS ECL equivalent output circuitry). The CMOS output circuitry 100 operates to receive a signal output from CMOS circuitry and convert the signal for use by an ECL circuit (e.g., CMOS to ECL conversion).

The CMOS output circuitry 100 includes a power control circuit 102, differential feedback amplifier circuitry 104 (e.g., sets logic-high signals), logic-low setting circuitry 106, and electrostatic discharge (ESD) circuitry 108. The CMOS output circuitry 100 is shown to output signals to PKG 110 (e.g., package including circuitry to connect to the package pin). The signal is then transmitted through the package out onto the board (on which the CMOS output circuitry 100 sits), across a 50 ohm resistor (on the board or receiving circuit) and received by an ECL input circuit.

The CMOS output circuitry 100 operates using a positive voltage supply (VDD) of 0.0 Volts, a negative voltage supply (VSS) of −5.2 Volts, and a voltage termination (VTT) of −2.0 Volts. The CMOS output circuitry 100 operates using a negative voltage scale so as to facilitate conversion of CMOS to ECL signals (e.g., so that a signal output of the CMOS output circuit 100 will be about −0.9 V for a logic high and about −1.8 V for a logic low).

The power control circuit 102 includes two inverters 112 and 114 and a NOR gate 116. The inverter 112 receives a signal (IN) from an integrated circuit, which is the signal to be output from the integrated circuit and transmitted off the chip. The power control circuit 102 performs an as enable/disable switch for the differential amplifier circuitry 104. If the IN signal is a logic high, and the power is on (PWR is a logic high), then the power control circuit 102 enables the differential amplifier circuitry 104 to operate (e.g., outputs a logic high). If the IN signal is a logic low, and the power is on (PWR is a logic high), then the power control circuit 102 disables the differential amplifier circuitry 104, and the output is a logic low. Otherwise, if the PWR signal is a logic low, the CMOS output circuitry 104 and 106 is disabled.

The power control circuit 102 outputs to the differential amplifier circuitry 104, which includes a differential feedback amplifier 118, a PMOS transistor 119 (that has an inverted power signal input to the gate), a diode 120 and resistor 122, and a PMOS transistor 124. The diode 120 is connected between the positive voltage supply (VDD) and the resistor to create a reference voltage (VrefH) to be input to the differential feedback amplifier 118. Using a VDD of 0.0 V, a VSS of −5.2 Volts, and an appropriate value ($R_1$) for the resistor 122, the reference voltage (VrefH) output from the diode 120, is a reference voltage level for a logic high signal in ECL circuitry, e.g., about −0.9V.

Due to the operational characteristics of a diode and a resistor, the reference voltage (VrefH) changes with temperature changes. For example, the forward voltage drop across a diode depends upon the temperature of the p-n junction in the diode, e.g., the forward voltage drop across the diode decreases as the temperature increases. Similarly, as the temperature increases, the resistance of a resistor generally increases. Thus, the diode 120 outputs a reference voltage that is temperature dependent.

The differential feedback amplifier 118 receives the reference voltage (VrefH) from the diode 120 at the negative input and a feedback signal at the positive input to monitor the signal out of the ECL circuit and to maintain the output signal's voltage at a desired level. The differential feedback amplifier 118 outputs to a gate of the PMOS transistor 124, and receives the output of the PMOS transistor 124, through the ESD circuitry 108, at the positive input as the feedback signal.

The differential amplifier circuitry 104 operates to set the CMOS output circuit's logic high output state. For instance, when the IN signal is a logic high (and PWR is on), the differential feedback amplifier 118 is active and will pass a voltage signal to the PMOS transistor 124. Because the CMOS output circuit 100 operates on a negative voltage scale and VDD is 0.0 volts, the PMOS transistor 124 will receive a negative voltage signal, then turn on, and will start to pull up the output to the package 110 toward VDD (0 V). However, due to the feedback signal to the differential feedback amplifier 118, the differential feedback amplifier 118 will continue to increase or decrease the signal output to the PMOS transistor 124 so that the output to the package PCK 110 is about equal to the VrefH (e.g., about −0.9).

The value of VrefH output from the diode 120 will change due to temperature changes. For example, as the temperature increases, the input to the negative input of the differential amplifier increases. Thus, the differential feedback amplifier 118 operates to monitor and maintain the value of the output of the ECL circuit at a desired level as affected by temperature changes using feedback. Because typical ECL signals vary as the temperature varies, the differential feedback amplifier 118 enables the signals to vary according to temperatures as well to mimic traditional ECL output circuitry.

The differential amplifier loop is an active circuit that will continually adjust the output using feedback. The differential feedback amplifier 118 tries to make the output voltage at PKG 110 equal to the reference voltage. For example, once the differential feedback amplifier 118 senses the output voltage sent to PKG 110, the differential feedback amplifier 118 can adjust the voltage to the gate of the PMOS transistor 124 to make the output voltage equal to the reference voltage. Thus, the differential amplifier circuitry 104 maintains the CMOS output circuitry 100 output voltage at a substantially same level as the reference voltage. Since the reference voltage (VrefH) changes with temperature (e.g., the reference voltage increases as the temperature increases), the CMOS logic high output voltage also changes with temperature (e.g., the output voltage increases as the temperature increases). As an example, when the IN signal is a logic high, the differential amplifier circuitry 104 is enabled, and the reference voltage $V_{refH}$ will be about −0.9V (due to values of VDD, VSS and $R_1$). Thus, the differential feedback amplifier 118 will output a negative voltage (e.g., about −1.5V) to gate of the PMOS transistor 124, which will try to pull the output up toward VDD. However, the feedback loop monitors the output of the PMOS transistor 124 (through the ESD circuitry 108), so that when the output of the PMOS transistor 124 increases above $V_{refH}$, the signal sent from the differential feedback amplifier 118 to the gate of the PMOS transistor 124 changes (increases toward VDD) so that the PMOS transistor 124 will reduce its drive strength, and the output to the PKG 110 will settle to an ECL logic high (e.g., about −0.9 V).

The differential feedback amplifier circuitry 104 outputs onto the same node as the logic low setting circuitry 106, which operates to set the CMOS output circuitry's logic low output. The logic low setting circuitry 106 includes a PMOS transistor 126 connected to a diode 128, which outputs to an NMOS transistor 130 across a resistor 132 that is connected to VSS. The gate of the PMOS transistor is connected to an inverted PWR signal (e.g., PWRN), so that the PMOS transistor is on when PWR is on.

When the CMOS output circuitry's output is a logic low, e.g., IN is a logic low, the differential amplifier circuitry 104 is off, and thus the output of the NMOS transistor 130 is an logic low which is passed to the PKG 110. For example, when the PWR is on, a reference voltage ($V_{refL}$) is created using the diode 128, and the resistor 132 (at an appropriate value $R_2$). The NMOS transistor 130 then shifts the voltage lower to be sent out to the board. Like the reference voltage ($V_{refH}$), the reference voltage ($V_{refL}$) is also temperature dependent in the same fashion due to the characteristics of the diode 128 and the resistor 132.

When the output signal switches to a logic high, the differential feedback amplifier circuitry 104 turns on and starts to pull up the output. The NMOS transistor 130 turns off automatically, because once the PMOS transistor 124 has pulled up the output higher than the NMOS transistor 130 threshold voltage, the NMOS transistor 130 is off.

The logic low setting circuitry 106 is configured in a source follower configuration as shown in FIG. 2. The passive setting of the logic low output state allows several ECL outputs to be wired-or together as in legacy ECL designs.

The CMOS output circuitry 100 thus is configured to maintain a logic high output or logic low output in view of temperature changes. The high and low reference voltages ($V_{refH}$ and $V_{refL}$) have the same temperature characteristics in that they increase as the temperature increases.

The CMOS output circuitry is also shown to include the ESD circuitry 108, which guards against an voltage differential between two surfaces that is sufficiently high enough to break down the dielectric strength of the medium separating the two surfaces. When static charge moves during an ESD event, the static charge becomes a current that may damage or destroy gate oxide, metallization, and junctions of circuitry in an integrated circuit.

The ESD circuitry 108 includes resistors 134 and 136, and diodes 138 and 140. The ESD circuitry 108 is connected between the package PKG 110, the output of the differential amplifier circuitry 104, the output of logic low setting circuitry 106, and the positive input to differential amplifier 118. The ESD circuitry 108 thus ensures that the output circuit is not damaged by an ESD event.

Figure 3:
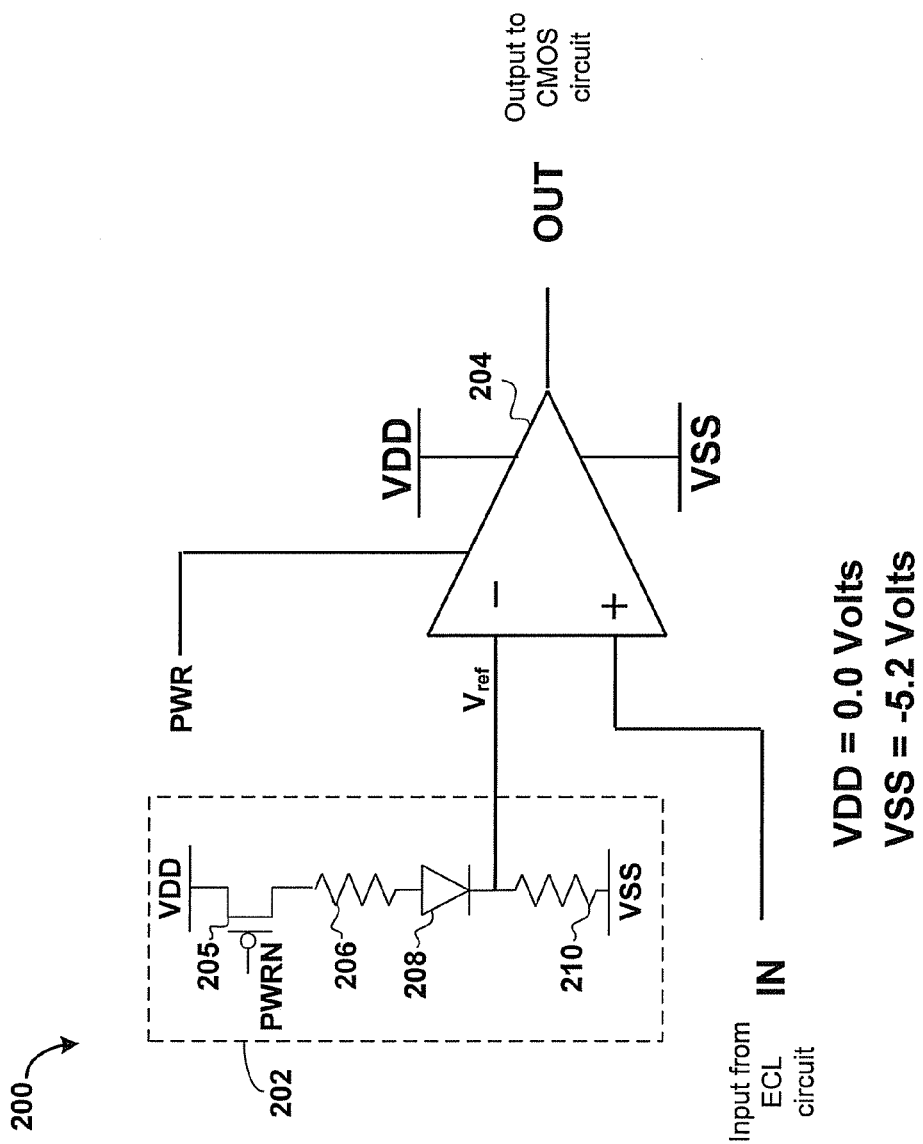
FIG. 3 is a circuit diagram showing an example of a CMOS ECL input circuit.

Turning now to FIG. 3, a circuit diagram showing an example of a CMOS input circuitry 200 is provided. The CMOS input circuitry 200 receives an ECL signal from an ECL circuit and outputs a CMOS signal to CMOS circuitry. The CMOS input circuitry 200 operates using the same voltage levels as the CMOS output circuitry 100, e.g., a positive voltage supply (VDD) of 0.0 Volts and a negative voltage supply (VSS) of −5.2 Volts.

The CMOS input circuitry 200 includes reference voltage setting circuitry 202 and a differential amplifier 204. The voltage setting circuitry 202 includes a PMOS transistor 205, and a resistor 206 coupled to a diode 208 that outputs across a resistor 210. The diode 208 outputs a reference voltage to the negative input of the differential amplifier 204 (similar as with the differential feedback amplifier 118 in the CMOS output circuitry 100 of FIG. 1). A received input signal, IN, is received at the positive input of the differential amplifier 204.

The differential amplifier 204 compares the received IN signal with the reference voltage, which is temperature dependent, to output a signal to core CMOS circuitry. The differential amplifier 204 can detect when the IN is below or above the reference voltage. For example, if the reference voltage is at −1.3 Volt, and the IN signal is at −1.1V, then the differential amplifier 204 determines that an ECL logic high has been received and outputs VDD. Alternatively, if the reference voltage is at −1.3 Volt and the IN signal is at −1.5V, then the differential amplifier 204 determines that an ECL logic low has been received and outputs VSS. Thus, it is desired to have the reference voltage level remain centered between the voltage levels of typical ECL logic high and logic low signals so that the differential amplifier 204 can compare the received signal and easily determine whether to output a logic high or low.

The IN signal will change due to temperature changes. Thus, within the CMOS input circuitry 200, Vref changes with temperature changes so that the CMOS input circuitry 200 applies a Vref that is centered and changes with temperature in the same way that the ECL IN voltage signal changes to properly convert the IN signal to CMOS levels in view of temperature changes.

Using the circuit designs of the present application, many different configurations may be implemented for different uses. Example configurations include a single ended output, a single ended input, a differential output, a differential input, a bidirectional single-ended input/output, and a VBB generator. Some of these example interface cells are explained below.

Figure 4A:
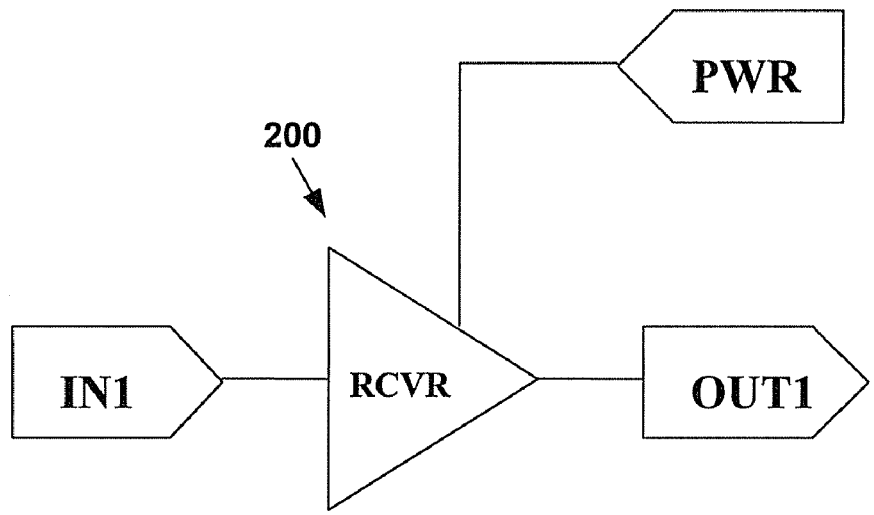
FIG. 4A is a circuit diagram showing an example configuration of the CMOS ECL input circuitry as a single ended input for receiving ECL signals.
Figure 4B:
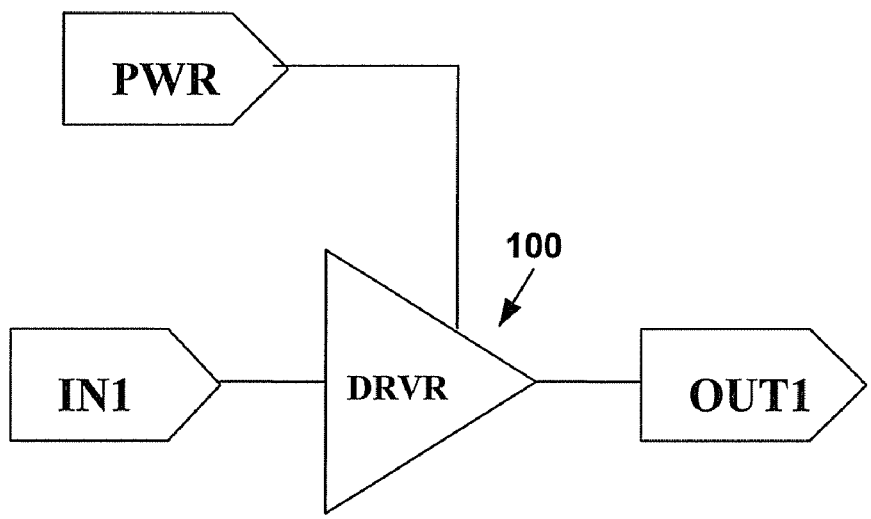
FIG. 4B is a circuit diagram showing an example configuration of the CMOS ECL output circuitry as a single ended output driver.
Figure 4C:
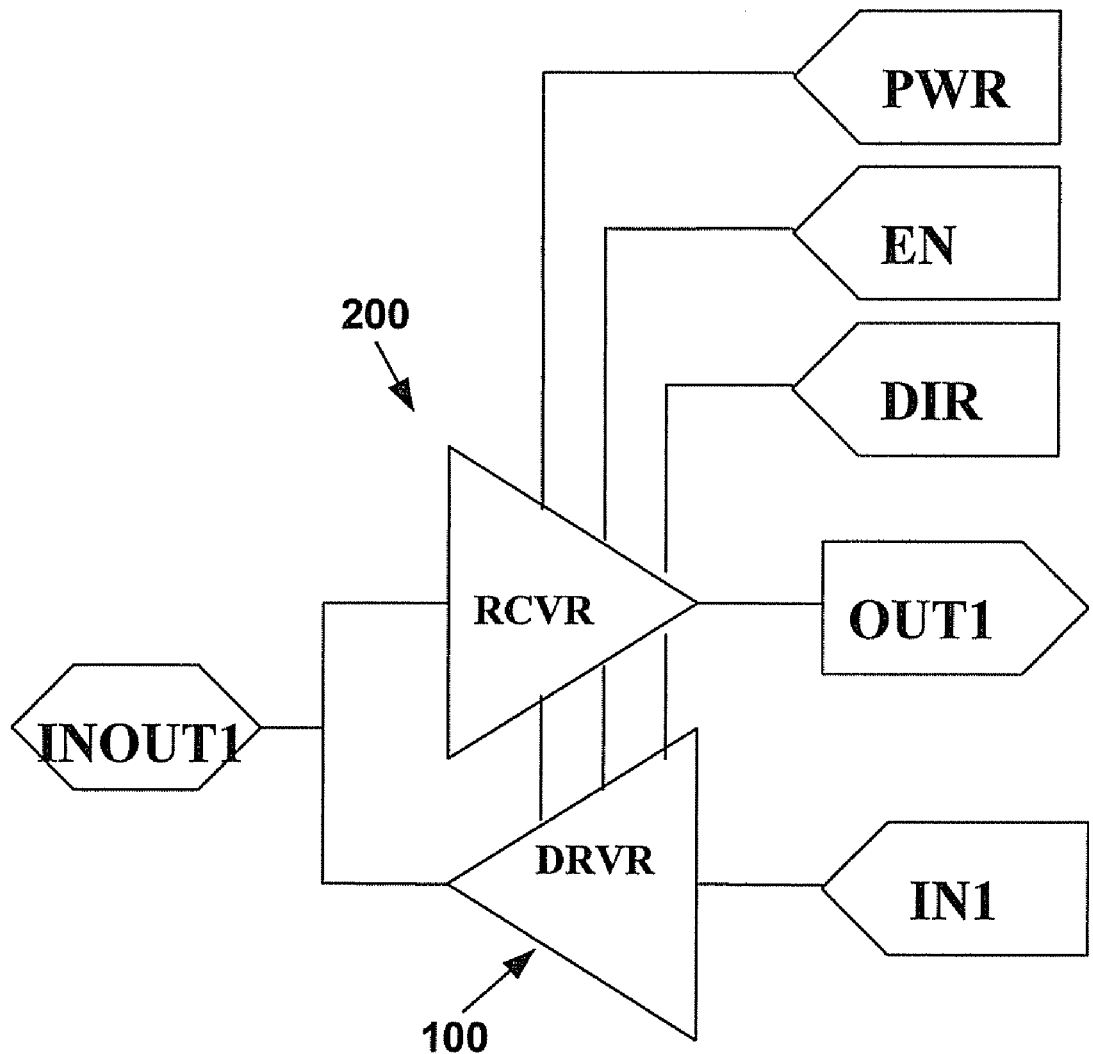
FIG. 4C is a circuit diagram showing an example configuration of the CMOS ECL input circuitry and the CMOS ECL output circuitry as a bidirectional single-ended input/output.

FIG. 1 illustrates a block diagram of an example circuitry layout used in the present application. FIGS. 4A-4C illustrate different configurations using the CMOS output circuitry 100 and the CMOS input circuitry 200. In FIG. 4A, the CMOS input circuitry 200 is configured as a single ended input for receiving ECL signals (the "RCVR" in the circuit represents the CMOS input circuitry 200). The single ended input for receiving ECL signals operates as shown in Table 1. Note that when PWR is a logic high (1), the power is on, and when PWR is a logic low (0), the power is off. Also, $V_{iL}$ is a valid ECL input-low, and $V_{iH}$ is a valid ECL input-high. An "X" input is a logic don't care.

TABLE 1

| IN1 | PWR | OUT1 | Function |
|---|---|---|---|
| X | 0 | 0 | Power off |
| $V_{iL}$ | 1 | 0 | Receive low |
| $V_{iH}$ | 1 | 1 | Receive high |

In FIG. 4B, the CMOS output circuitry 100 is configured as a single ended output driver (e.g., "DRVR" represents the CMOS output circuitry 100). The differential output driver operates as shown below in Table 5. The signal $V_{oL}$ is a valid ECL output-low, and $V_{oH}$ is a valid ECL output-high.

TABLE 2

| IN1 | PWR | OUT1 | Function |
|---|---|---|---|
| X | 0 | Z | Power off |
| 0 | 1 | $V_{oL}$ | Drive low |
| 1 | 1 | $V_{oH}$ | Drive high |

The configuration of the CMOS input circuitry 200 and the CMOS output circuitry 100 as a bi-directional single-ended input/output is shown in FIG. 4C. The bi-directional single-ended input/output operates as shown below in Table 3.

TABLE 3

| IN1 | EN | DIR | PWR | INOUT1 | OUT1 | Function |
|---|---|---|---|---|---|---|
| X | X | X | 0 | Z | 0 | Power off |
| X | 0 | X | 1 | Z | 0 | Disabled |
| 0 | 1 | 0 | 1 | Z | 0 | Drive low* |
| 1 | 1 | 0 | 1 | $V_{oH}$ | 1 | Drive high |

TABLE 3-continued

| IN1 | EN | DIR | PWR | INOUT1 | OUT1 | Function |
|---|---|---|---|---|---|---|
| X | 1 | 1 | 1 | $V_{iL}$ | 0 | Receive low |
| X | 1 | 1 | 1 | $V_{iH}$ | 1 | Receive high |

Note that EN is an enable signal, DIR is a signal indicating whether to operate as an input (value of 1) or as an output (e.g., value of 0), $V_{oL}$ is a valid ECL output-low, $V_{oH}$ is a valid ECL output-high, $V_{iL}$ is a valid ECL input-low, $V_{iH}$ is a valid ECL input-high, and Z is a high impedance. The driver may have no output low circuitry, and thus the output can be pulled low by the external termination, which allows the driver to be used on large multi-drop busses.

The present application includes CMOS input and output circuitry that is configured to mimic voltage levels and characteristics of legacy ECL input and output circuitry. For example, within ECL input/output circuitry, signaling levels were designed to shift with temperature changes due to inherent characteristics of bipolar transistors. Similarly, in the CMOS output circuitry 100, active circuitry with feedback and the temperature characteristics of a diode are used to create the temperature dependent signaling characteristics required to match legacy ECL signaling levels.

Figure 5:
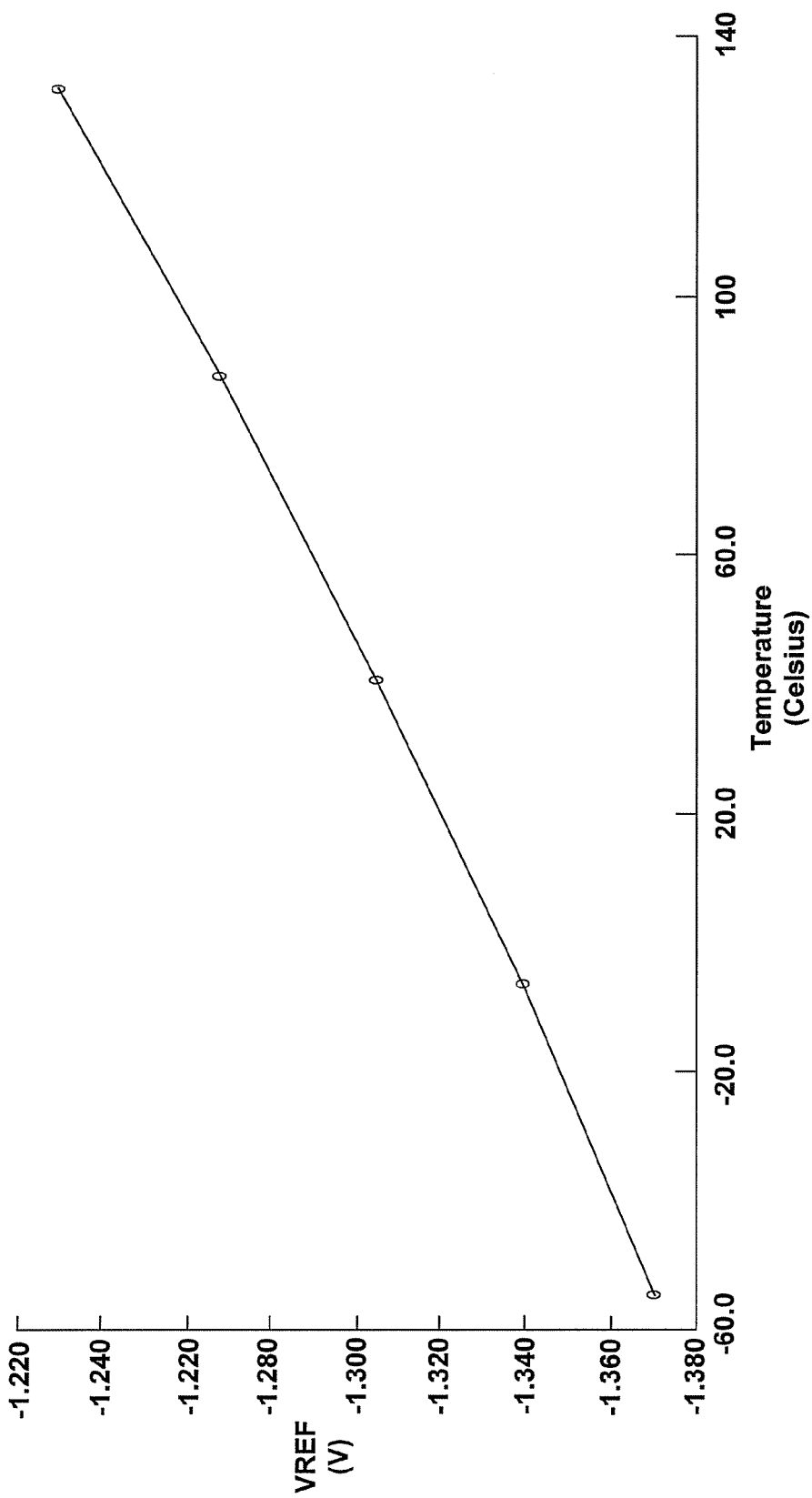
FIG. 5 is a graph illustrating an example of the temperature dependence of the reference voltage within the CMOS ECL input circuit.

FIG. 5 is a graph illustrating an example of the temperature dependence of the reference voltage output from diode 208 in the CMOS input circuitry 200. For example, the output reference voltage (VREF) increases as the ambient temperature increases.

Figure 6:
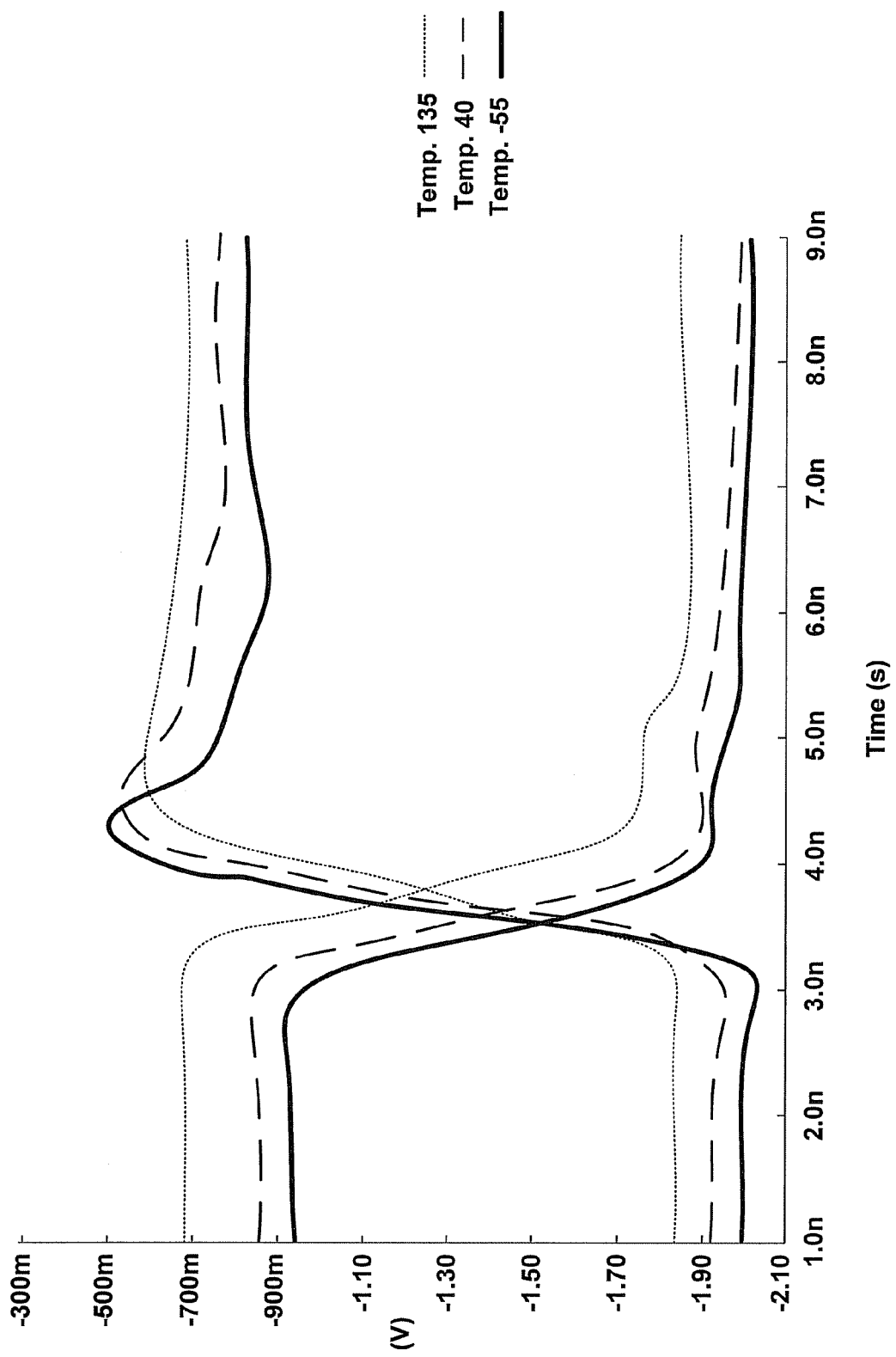
FIG. 6 is a graph illustrating an example of the temperature dependence of the output voltages over time output from the CMOS ECL output circuit.

FIG. 6 is a graph illustrating an example of the temperature dependence of the output voltage of the CMOS output circuitry 100 over time. For example, as the temperature increases from −55° C. to 40° C. to 135° C., the output voltage increases. The graph estimates that between −55° C. and 135° C., the voltage increases approximately 0.16-0.18 V.

The graphs in FIGS. 4-5 illustrate the temperature dependent voltage levels present within the CMOS input/output circuitry of the present application to match legacy ECL input/output voltage signaling levels.

In addition, the power supply voltages used in the CMOS input circuitry 200 and the CMOS output circuitry 100 are the same as used within typical legacy ECL input/output circuit designs (0V and −5.2V). In this manner, the CMOS input circuitry 200 and the CMOS output circuitry 100 can correctly interface with legacy designs.

It should be understood that the arrangements described herein are for purposes of example only. As such, those skilled in the art will appreciate that other arrangements and other logic or circuit elements can be used instead, and some elements may be omitted altogether according to the desired results. Further, many of the elements that are described are functional entities that may be implemented as discrete or distributed components or in conjunction with other components, in any suitable combination and location. As an example, many other components may be included within the circuitry (additional transistors, resistors, etc) and the circuitry will operate to perform the same functions as intended by the present application.

It is intended that the foregoing detailed description be regarded as illustrative rather than limiting, and it is intended to be understood that the following claims including all equivalents define the scope of the invention.

What is claimed is:

1. A Complementary Metal-Oxide Semiconductor (CMOS) Emitter Coupled Logic (ECL) output circuit having an input and an output, wherein the input is arranged to receive an input signal from a CMOS circuit and the output is arranged to provide an output signal to an ECL circuit, the CMOS ECL output circuit comprising:

a CMOS differential amplifier having first and second inputs and an output;

a reference circuit arranged to provide a reference voltage to the first input of the CMOS differential amplifier, wherein the reference voltage varies based on a temperature of the CMOS ECL output circuit;

a feedback loop coupled between the output of the CMOS differential amplifier and the second input of the CMOS differential amplifier, the feedback loop carrying a signal to maintain the output signal of the ECL circuit at about the same level as the reference voltage, wherein the output signal varies in about the same manner as the reference voltage varies due to temperature changes;

wherein the CMOS differential amplifier is disabled when the input signal from the CMOS circuit and the output signal provided to the ECL circuit is a logic low; and wherein a first device drives the output of the CMOS ECL output circuit when the input signal from the CMOS circuit and the output signal provided to the ECL circuit is a logic low, and wherein a second device different than the first device drives the output of the CMOS ECL output circuit when the input signal from the CMOS circuit and the output signal provided to the ECL circuit is a logic high.

2. The CMOS ECL output circuit of claim 1, wherein the reference circuit comprises a diode coupled between a CMOS logic high voltage and a resistor, which couples to a CMOS logic low voltage, wherein an output of the diode is the reference voltage.

3. The CMOS ECL output circuit of claim 2, wherein due to operational characteristics of the diode and the resistor, the reference voltage varies due to temperature changes.

4. The CMOS ECL output circuit of claim 1, wherein the CMOS differential amplifier is enabled when the input signal from the CMOS circuit and the output signal provided to the ECL circuit is a logic high.

5. The CMOS ECL output circuit of claim 4, further comprising a logic-low setting circuit that is enabled when the input signal from the CMOS circuit and the output signal provided to the ECL circuit is the logic low.

6. The CMOS ECL output circuit of claim 5, wherein the logic-low setting circuit includes a diode coupled between a CMOS logic high voltage and a resistor, which couples to a CMOS logic low voltage, wherein an output of the diode is an ECL logic low voltage signal.

7. The CMOS ECL output circuit of claim 5, wherein the logic-low setting circuit couples to an output of the CMOS differential amplifier, and wherein when the input signal from the CMOS circuit and the output signal provided to the ECL circuit is the logic high so that the CMOS differential amplifier is enabled, the logic-low setting circuit is shut off.

8. The CMOS ECL output circuit of claim 1, further comprising electrostatic discharge (ESD) circuitry coupled between the output of the CMOS differential amplifier and the output of the CMOS ECL output circuit.

9. The CMOS ECL output circuit of claim 1, further comprising a CMOS ECL input circuit having an input and an output, wherein the input of the CMOS ECL input circuit is arranged to receive an output signal from the ECL circuit and the output of the CMOS ECL input circuit is arranged to provide an input signal to the CMOS circuit.

10. The CMOS ECL output circuit of claim 9, wherein the CMOS ECL input circuit includes:

a second CMOS differential amplifier having first and second inputs, wherein the output from the ECL circuit is input to the second input of the second CMOS differential amplifier; and a second reference circuit arranged to provide a second reference voltage to the first input of the second CMOS differential amplifier, wherein the second reference voltage varies based on a temperature of the second CMOS ECL input circuit, wherein the second CMOS differential amplifier is arranged to output an output signal to the CMOS circuit, wherein the output signal to the CMOS circuit, in response to temperature changes, varies in about the same manner as the output signal from the ECL circuit varies due to the temperature changes.

11. The CMOS ECL output circuit of claim 10, wherein the second reference circuit includes a second diode coupled between the CMOS logic high voltage and a second resistor, which couples to the CMOS logic low voltage, and wherein an output of the second diode is the second reference voltage.

12. The CMOS ECL output circuit of claim 1, wherein the CMOS circuit operates using a positive voltage supply of about 0.0 V and a negative voltage supply of about −5.2 V, so that so that the output signal to the ECL circuit will be about −0.9 V for a logic high and about −1.8 V for a logic low.

13. The CMOS ECL output circuit of claim 1, wherein the CMOS ECL output circuit operates in a manner so as to mimic operation of an ECL output circuit created using bipolar transistors.

14. The CMOS ECL output circuit of claim 1, wherein the feedback loop includes a PMOS transistor coupled to a CMOS logic high signal, and wherein the feedback loop maintains outputs of the PMOS transistor to about the same level as the reference voltage.

15. A complementary metal-oxide semiconductor (CMOS) emitter coupled logic (ECL) input/output (I/O) circuitry comprising:

a CMOS ECL input circuit comprising:

a first input and a first output, the first input of the CMOS ECL input circuit receiving an output from an ECL circuit and the first output of the CMOS ECL input circuit outputting an input to a CMOS circuit, wherein the input to the CMOS circuit, in response to temperature changes, varies in about the same manner as the output from the ECL circuit varies due to the temperature changes; and a CMOS ECL output circuit comprising:

a CMOS differential amplifier having first and second inputs and an output;

a reference circuit arranged to provide a reference voltage to the first input of the CMOS differential amplifier, wherein the reference voltage varies based on a temperature of the CMOS ECL output circuit;

a feedback loop coupled between the output of the CMOS differential amplifier and the second input of the CMOS differential amplifier, the feedback loop carrying a signal to maintain the output signal of the ECL circuit at about the same level as the reference voltage, wherein the output signal varies in about the same manner as the reference voltage varies due to temperature changes;

wherein the CMOS differential amplifier is disabled when the input signal from the CMOS circuit and the output signal provided to the ECL circuit is a logic low; and wherein a first device drives the output of the CMOS ECL output circuit when the input signal from the CMOS circuit and the output signal provided to the ECL circuit is a logic low, and wherein a second device different than the first device drives the output of the CMOS ECL output circuit when the input signal from the CMOS circuit and the output signal provided to the ECL circuit is a logic high.

16. The CMOS ECL I/O circuitry of claim 15, wherein the feedback loop monitors the input to the ECL circuit to maintain an ECL logic high output or an ECL logic low output in view of temperature changes.

17. A Complementary Metal-Oxide Semiconductor (CMOS) Emitter Coupled Logic (ECL) output circuit of claim 1, wherein the second device is a transistor.

18. The Complementary Metal-Oxide Semiconductor (CMOS) Emitter Coupled Logic (ECL) output circuit of claim 17, wherein the transistor is a PMOS transistor.

19. The Complementary Metal-Oxide Semiconductor (CMOS) Emitter Coupled Logic (ECL) output circuit of claim 17, wherein the transistor is arranged as a current source.

* * * * *